United States Patent [19]

Beard

[11] Patent Number: 4,704,727

[45] Date of Patent: Nov. 3, 1987

[54] LOW NOISE AND DISTORTION FM TRANSMISSION SYSTEM AND METHOD

[76] Inventor: Terry D. Beard, 1407 N. View Dr., Westlake Village, Calif. 91362

[21] Appl. No.: 802,691

[22] Filed: Nov. 27, 1985

[51] Int. Cl.⁴ .............................................. H04H 5/00
[52] U.S. Cl. ...................................... 381/13; 381/106
[58] Field of Search ................... 381/2, 3, 4, 13, 106; 333/14

[56] References Cited

U.S. PATENT DOCUMENTS

| | | |
|---|---|---|
| 3,377,559 | 4/1968 | Stewart . |
| 3,379,839 | 4/1968 | Bennett . |
| 3,559,068 | 1/1971 | Almering et al. . |
| 3,602,818 | 8/1971 | Anderlecht et al. . |
| 3,885,111 | 5/1975 | Ishigami et al. . |
| 4,103,239 | 7/1978 | Meeweezen . |
| 4,123,711 | 10/1978 | Chow . |
| 4,169,219 | 9/1979 | Beard . |
| 4,353,035 | 10/1982 | Schroder . |
| 4,430,754 | 2/1984 | Ishigaki . |
| 4,449,106 | 5/1984 | Ishigaki et al. . |
| 4,485,483 | 11/1984 | Torick et al. . |
| 4,498,060 | 2/1985 | Dolby ............................. 381/106 |
| 4,534,054 | 8/1985 | Maisel ............................. 381/4 |
| 4,535,471 | 8/1985 | Kuroda ............................. 381/106 |
| 4,602,380 | 7/1986 | Stebbings ............................. 381/13 |

Primary Examiner—Forester W. Isen
Attorney, Agent, or Firm—Koppel & Harris

[57] ABSTRACT

An FM transmission system and method in which a gain control signal is generated and used to encode the audio signal in accordance with a predetermined compression curve. At the receiver the gain control signal is recovered and used to decode the audio signal, thereby providing a faithful reproduction of the original signal regardless of which compression curve is used. The compression curve can be tailored for optimum results for receivers with and without the decoding circuitry, depending upon the program material. The audio signal is delayed in the encoder while the gain control signal is generated, allowing the control signal to fully respond to changes in the audio signal without clipping the audio signal. The gain control signal is segregated from interfering with the remainder of the transmitted signal by restricting it to a low frequency bandwidth centered on the 38 KHz subcarrier for the L-R signal, and placing it in phase quadrature relation to the remainder of the transmitted signal. A number of different compression curve generators may be provided in the encoder to enable a selection among the different curves.

36 Claims, 19 Drawing Figures

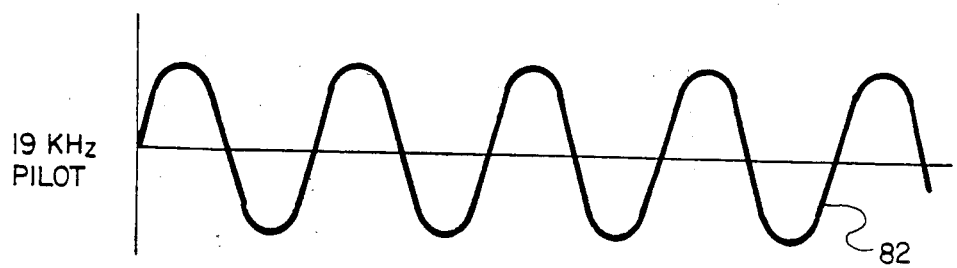
Fig.8.a.
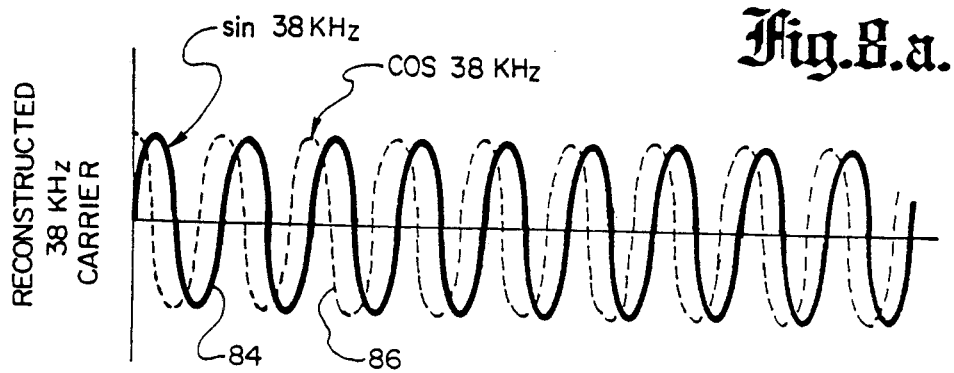
Fig.8.b.
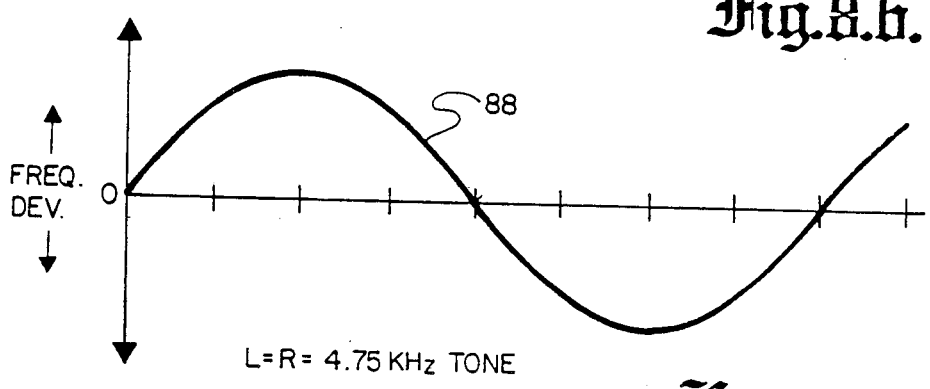
Fig.8.c.
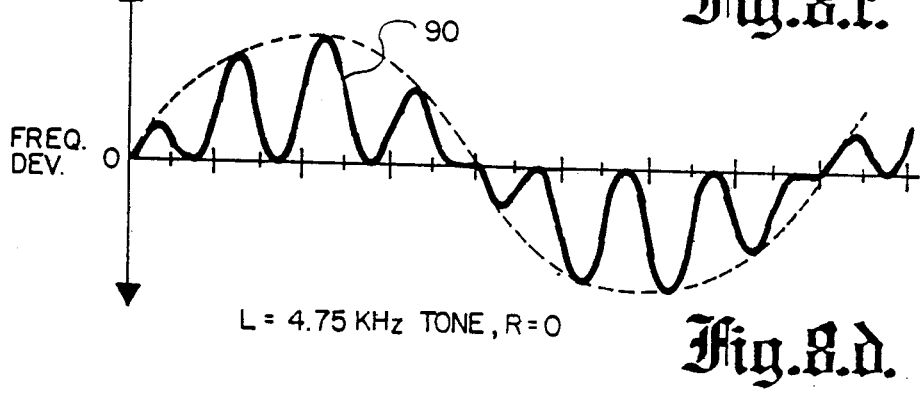
Fig.8.d.

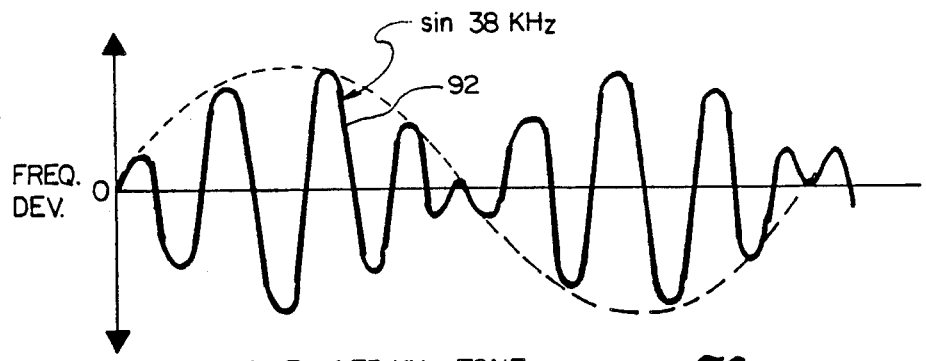
Fig.8.e.
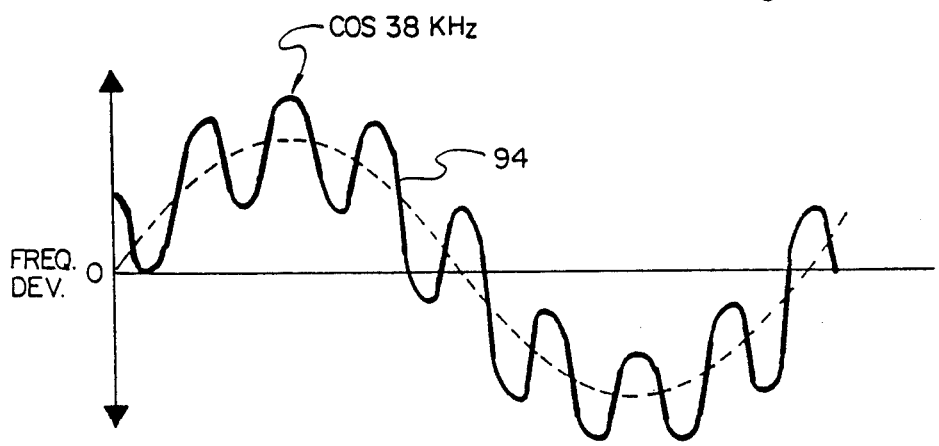
Fig.8.f.
Fig.8.g.
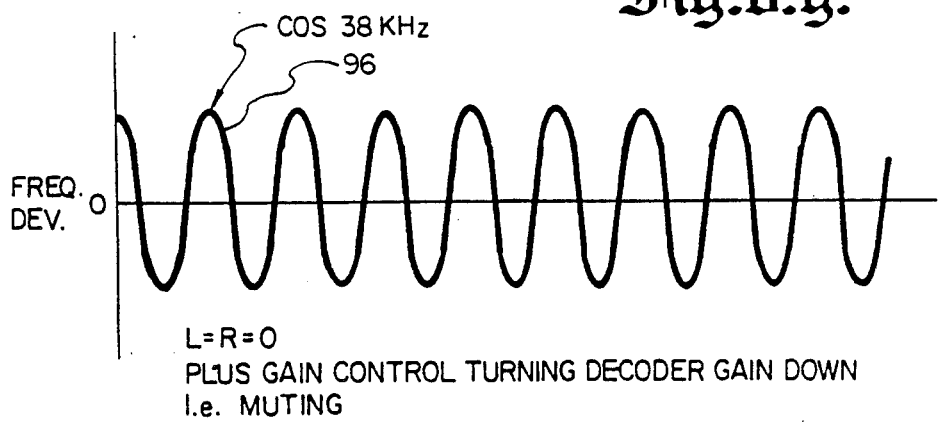

LOW NOISE AND DISTORTION FM TRANSMISSION SYSTEM AND METHOD

BACKGROUND OF THE INVENTION

1. Field of the Invention

This invention relates to FM radio transmission systems and methods, and more particularly to FM systems using special techniques to reduce noise and accurately match the received radio signal with the original audio signal submitted for transmission.

2. Description of the Prior Art

Commercial frequency modulated (FM) signals are broadcast in the radio spectrum from 88 to 108 MHz. There are 100 channels, each 200 KHz wide. The original audio signal is encoded as a frequency modulated signal with a maximum allowed frequency deviation of ±75 KHz. In stereo broadcasting the signal is encoded so that non-stereo receivers will receive a monaural signal equal to the sum of the left (L) and right (R) signals. This is accomplished by using the L−R signal in the form of a double sideband suppressed carrier signal to modulate a 38 KHz subcarrier, and adding the resulting signal to the L+R signal along with a 19 KHz pilot tone. The channel's main carrier is then FM modulated with the summed signal. The audio bandwidth is limited in all cases to a band of frequencies from about 50 Hz to 15 KHz. The 38 KHz subcarrier for the L−R signal is suppressed to minimize the required FM deviation of the main carrier during broadcast, while a 19 KHz pilot tone is phase-locked to the 38 KHz subcarrier and broadcast along with the composite signal to allow synchronous demodulation of the L−R signal.

A conventional transmission system is illustrated in FIG. 1. The left and right stereo audio signals are applied to a matrixing circuit 2 which outputs the sum L+R and difference L−R of the two signals. The L−R signal goes to one input of a four quadrant multiplier 4, the other input to which is taken from a 38 KHz oscillator 6. Multiplier 4 produces an output in the form of a double sideband suppressed carrier modulation of the L−R signal on the 38 KHz reference signal. The 38 KHz signal is also frequency divided by two in a frequency divider circuit 8 to generate a 19 KHz pilot signal. A summing circuit 10 adds the 19 KHz pilot signal, the 38 KHz signal modulated by the L−R signal, the L+R signal, and a conventional subsidiary communication authorization (SCA) 60-75 KHz signal. The resulting composite signal is delivered to an FM modulator 12, where it modulates the carrier signal at the center of the broadcast band.

The frequency spectrum of the composite broadcast signal is illustrated in FIG. 2. Taking the carrier frequency as a zero reference, the spectrum to 15 KHz is occupied by the L+R signal, with a narrow subaudio deadband extending from the carrier up to the beginning of the audio level, typically about 50 Hz. The 19 KHz pilot tone is transmitted above the audio L+R level, but below the double sideband L−R level. The L−R double sidebands are centered on 38 KHz as illustrated, and extend ±15 KHz from this frequency, or from about 23 to 53 KHz. A relatively narrow subaudio deadband of about ±50 Hz is centered on the 38 KHz subcarrier between the two L−R sidebands; the width of this deadband is somewhat exaggerated in FIG. 2 for purposes of illustration. Beyond the L−R sideband the SCA signal is transmitted in a frequency band of 60–75 KHz.

FIG. 3 is a simplified diagram of a conventional receiver used to demodulate the transmitted composite stereo signal. The received signal is fed to a 76 KHz oscillator 14 which phase-locks to the 19 KHz pilot tone. The output of oscillator 14 is frequency divided by flip-flop circuit 36 to produce a 38 KHz square wave in-phase with the suppressed 38 KHz carrier. The 38 KHz signal flip-flop 16 and the received composite signal are both delivered to a synchronous demodulator circuit 18, which acts as a synchronous signal directing switch. Demodulation is accomplished by switching the input to the synchronous demodulator to a left channel output during the positive portion of the 38 KHz reference signal, and to a right channel output during the negative portion of the 38 KHz reference signal. This technique is illustrated in FIG. 4, in which the synchronous demodulator is shown as being implemented by a switch 20 which is exercised at a 38 KHz rate. Since the switching occurs above audio frequency, its effects are easily removed from the output signals by providing low pass filters 22 and 24 in the left and right channel output lines to pass the audio signals but filter out the higher frequency switching signals. FM demodulation can be accomplished commercially by single chip integrated circuits which receive the composite signal and produce left and right channel output audio signals with this technique. Typical chips may be used for this purpose are the National Semiconductor Corporation LM1800, and the RCA Corporation CA3090AQ.

The useful dynamic range of commercial FM broadcast is typically 60 to 70 dB. However, digital audio recordings typically have dynamic ranges of greater than 90 dB. In order to fit a 90 dB audio signal range into a 60-70 dB transmission range, and also to increase the "loudness" of a broadcast for a given allowable transmission power, broadcasters typically "compress" and "limit" their signals to place the average signal as far above the noise floor as practical. Unfortunately, this type of signal encoding has several undersirable effects. Since the signal levels are boosted up towards a maximum permissible level during heavy limiting, the difference between transmitted signal levels tends to be much less than the difference between the original signal levels. This compression of the diferences in signal amplitudes at the transmission end makes it much more difficult to differentiate between different signal levels to restore the original audio signal at the receiving end. Conventional companding techniques are incapable of accurately determining the proper expansion at the receiver because the changes in transmitted signal amplitude are so small during heavy limiting. In addition, the use of limiters and compressors to boost the transmitted signal level in general so as to achieve a louder sound results in clipping signal peaks to avoid overshoot beyond the maximum transmission level permitted by governmental authorities. The advent of digital audio discs with their wider dynamic range makes it particularly desirable to increase the effective dynamic range of a commercial FM broadcast.

SUMMARY OF THE INVENTION

In view of the above problems associated with the prior art, it is an object of this invention to provide a novel and improved system and method for increasing the effective dynamic range of commercial FM broadcasts, while at the same time increasing the accuracy with which the original audio signals are reproduced and doing so in a manner which is compatible with existing broadcast techniques.

Another object is the provision of such a system and method in which the dynamic range of the transmitted signal can be reduced for transmission purposes without losing the high reproduction accuracy associated with the original audio signal.

A further object is the provision of such a system and method in which the broadcaster is able to control and adjust the companding characteristics for particular programming, and to transmit a signal which will give improved reception for both conventional receivers and receivers constructed in accordance with the invention.

These and other objects of the invention are achieved by generating a relatively low frequency gain control signal at the transmitter to govern the compression of an input stereo signal in accordance with a desired compression curve. The input stereo signal is delayed for a period at least equal to the time required to generate the gain control signal, after which the gain control signal is used to encode the delayed stereo signal by controlling its gain. The gain control signal is transmitted along with, but without substantially interfering with, the delayed and encoded stereo signal. At the receiver the gain control signal is extracted from the transmitted composite signal and used to decode the transmitted stereo signal so as to achieve a faithful reproduction of the original audio signal. The gain control signal is segregated from the stereo signal during transmission by applying it in phase quadrature relation to the composite signal on the 38 KHz subcarrier, and restricting its bandwidth.

A number of different gain control signal generators, each one corresponding to a different signal compression curve, may be used at the transmitter. The broadcaster can select among the different gain control signals and choose the one that is best for the intended programming. A receiver equipped with a decoder will faithfully reproduce the original audio signal regardless of which gain control signal is used. Even if the receiver does not have the decoding apparatus, the avoidance of signal clipping at the transmission end results in better reception than is achieved by presently available systems.

These and other objects and features of the invention will be apparent to those skilled in the art from the following detailed description of preferred embodiments, taken together with the accompanying drawings, in which:

DESCRIPTION OF THE DRAWINGS

FIGS. 8a, 8b, 8c, 8d, 8e, 8f and 8g are signal traces illustrating the signals at various locations of the transmitter for different input signal conditions;

DETAILED DESCRIPTION OF PREFERRED EMBODIMENTS

Figure 1:
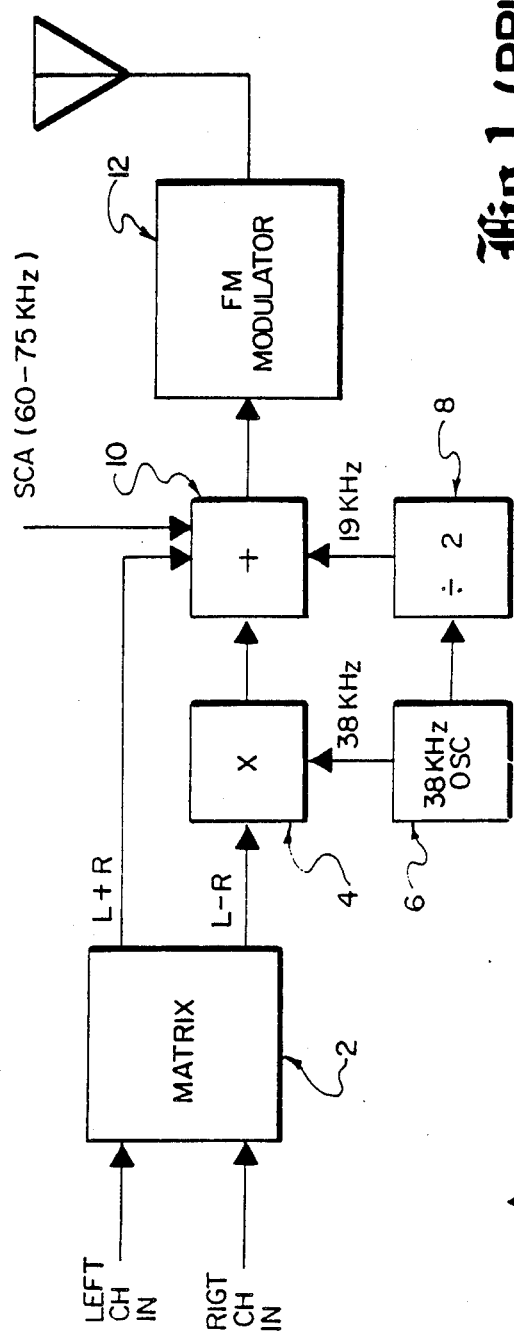
FIG. 1 is a block diagram of a prior art FM transmission circuit.
Figure 2:
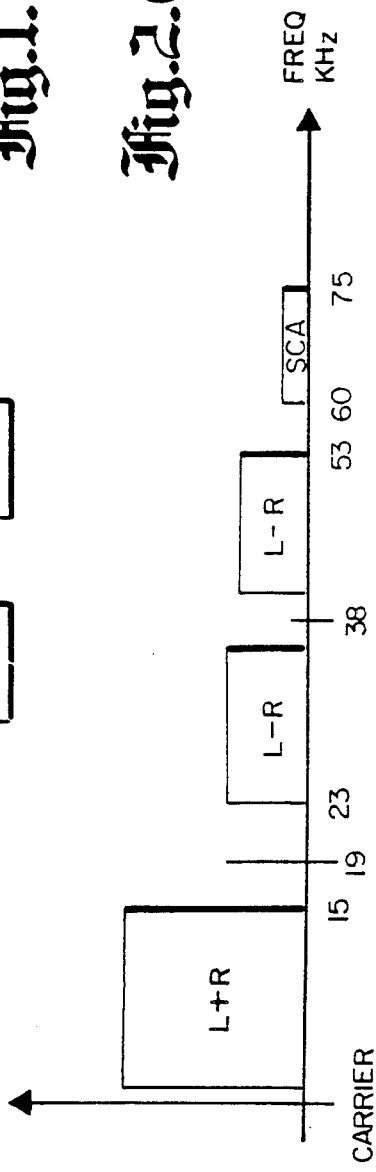
FIG. 2 is a plot of the frequency spectrum utilized in conventional FM stereo broadcasting.
Figure 3:
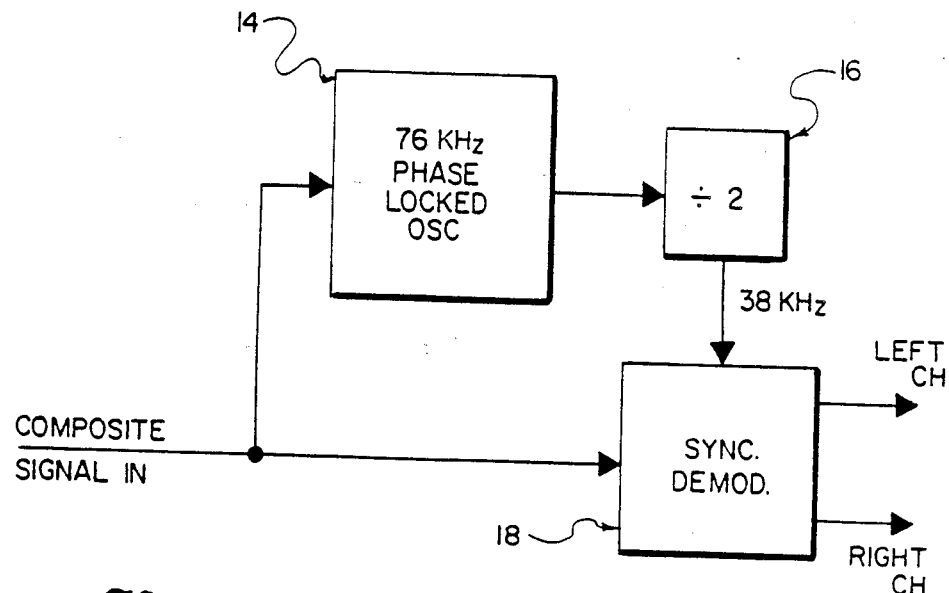
FIG. 3 is a block diagram of a typical prior art FM demodulator used in radio receivers.
Figure 4:
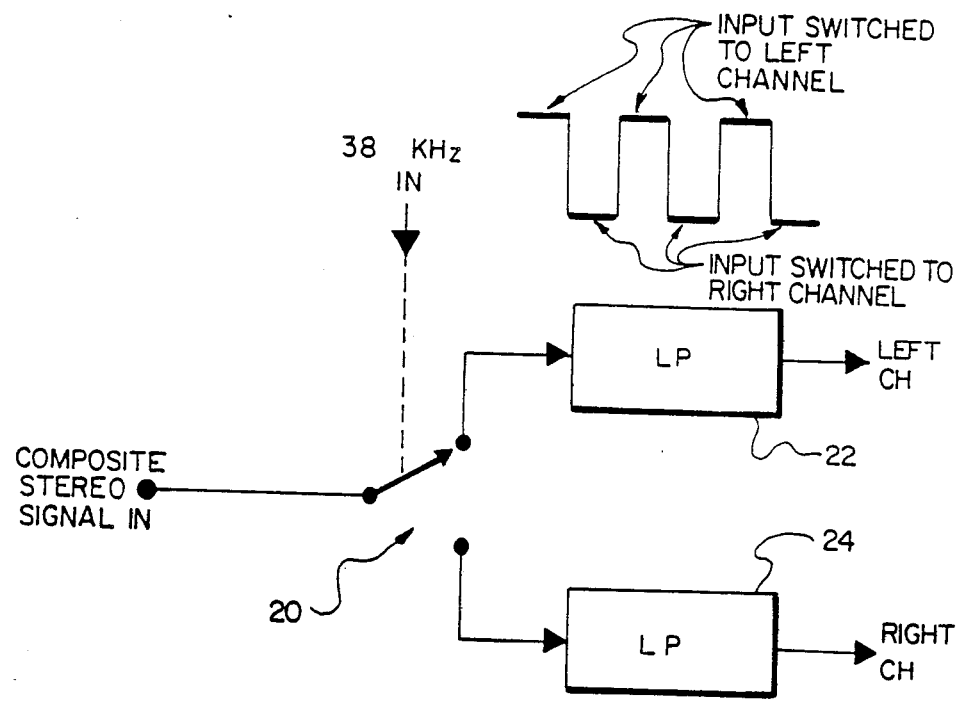
FIG. 4 is a block diagram of a prior art synchronous decoder used in the demodulator of FIG. 3.
Figure 5:
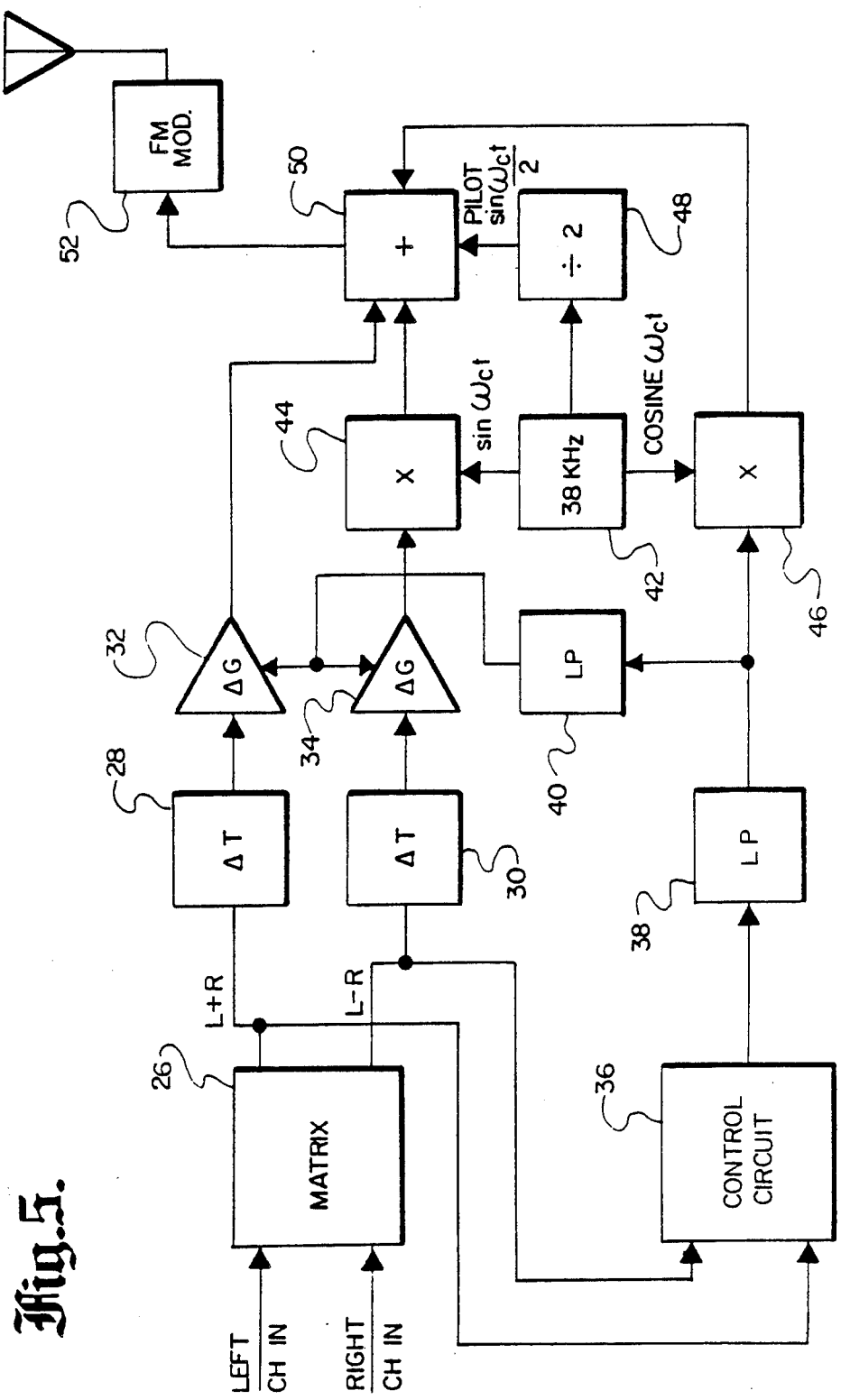
FIG. 5 is a block diagram of an encoder for FM stereo signals constructed in accordance with the present invention.

In accordance with the invention, an anticipatory companding gain control signal is added to the composite stereo signal in a manner that does not interfere with conventional broadcasts. FIG. 5 is a block diagram of a preferred system for encoding an audio signal for transmission. The left and right channel audio signals are converted into $L+R$ and $L-R$ signals by a matrix circuit 26. The matrixed $L+R$ and $L-R$ signals are delayed by audio delay circuits 28 and 30, respectively, and then respectively applied to gain control amplifiers 32 and 34 which control the gain of the matrixed signals in accordance with a desired compression curve. The $L+R$ and $L-R$ signals are also delivered to a control circuit 36, described in further detail below, which responds to the changing audio signals by producing a changing gain control signal to conform the audio signals to the desired compression curve. The output of control circuit 36 is restricted to a subaudio frequency band of less than 50 Hz by series connected low pass filters 38 and 40, and is then applied to gain control amplifiers 32 and 34. As a result the amplitudes of the delayed $L+R$ and $L-R$ signals are adjusted in accordance with the desired compression curve. The $L+R$ and $L-R$ signals are delayed by delay circuits 28 and 30 long enough for control circuit 36 and low pass filters 38 and 40 to operate. When a sudden large transient in the magnitude of the audio signal appears, such as a spike, the provision of delay circuits 28 and 30 give control circuit 36 enough time to respond to the new signal level and adjust the gain control signal accordingly so that the proper gain control is applied to the $L+R$ and $L-R$ signals by the time they reach gain control amplifiers 32 and 34. This avoids the signal clipping problem encountered in the prior art, and assures that the full information content of the input audio signals is retained for transmission. In the prior art, by contrast, the audio signal level sometimes momentarily exceeded the maximum permissible power limits established by the Federal Communications Commission even after compression. These portions of the compressed signal were simply clipped, resulting in audio distortion at the receiver. Further, even if there is no clipping, the lack of an industry standard signal compression curve makes it impossible, as a practical matter, to provide a single radio receiver capable of decoding the numerous different compression curves in current use.

A 38 KHz signal generator 42 provides the conventional 38 KHz subcarrier frequency for the $L-R$ signal. The delayed and compressed $L-R$ signal at the output of variable gain amplifier 34 is delivered to a four quadrant multiplier 44, where it is multiplied by the sine phase of the 38 KHz reference signal from oscillator 42. The cosine phase of the 38 KHz reference signal, which is 90° out of phase (in phase quadrature) with the sine phase applied to multiplier 44, is coupled into a second four quadrant multiplier circuit 46. The low frequency gain control signal at the output of low pass filter 38 is also applied to multiplier 46, where it is multiplied by the cosine phase of the 38 KHz reference signal. The 19 KHz pilot tone signal described previously is obtained by having the frequency of the 38 KHz reference signal in a frequency divider circuit 48.

A summing circuit 50 adds the following signals together to form a composite signal which is then FM modulated on the broadcast carrier for transmission: (1) the delayed and compressed L−R signal multiplied by the sine phase of the 38 KHz reference signal; (2) the delayed and compressed L+R signal; 3) the low frequency gain control signal placed on the phase quadrature component of the 38 KHz reference signal; and (4) the 19 KHz pilot tone. The resulting composite signal is modulated by conventional FM modulator 52 for radio transmissions.

Delay circuits 28 and 30 are high quality delays, such as digital audio delays, with delay times at least equal to the total of the rise times of the serial combination of control circuit 36 and low pass filters 38 and 40. A 10–25 millisecond delay is typical. Low pass filters 38 and 40 can have any desired number of poles to efficiently discriminate against higher audio frequencies, since the filter delays are accommodated by the audio delay circuits 28 and 30. Low pass filter 40 passes only that part of the spectrum passed by low pass filter 38. It should be accurately characterized, since a duplicate of filter 40 is used in the receiver to achieve complementary decoding, as described hereinafter.

The signal encoding system described thus far provides a high degree of flexibility for the design of control circuit 36. It is a unique and valuable feature of the invention that control circuit 36 can be implemented in a great number of different ways without departing from the overall encoding scheme. Its anticipatory feature is very desirable because it prevents momentary overload of the FM modulator during large scale transients, which is a strict requirement of the FCC. Thus, the system can perform the limiting and compressing functions currently employed in conventional FM broadcasts, and can do so in a superior manner because of the avoidance of signal clipping. At the same time, the preservation and transmission of the gain control signal as part of the composite FM signal enables the gain control signal to be extracted at the receiver and used to decode the compression and limiting applied to the stereo signal with a higher degree of accuracy than has heretofore been attainable.

The functions of the various circuit elements between matrix circuit 26 and FM modulator 52 can all be implemented digitally, with all signals represented in digital form. With a digital implementation the compression curve is stored in digital memory in the control circuit. The incoming signals are converted to digital form directly following matrix circuit 26 and the composite digital signal from circuit 50 is converted back to analog form in a digital-to-analog converter before being applied to the FM modulator 52.

An accurate reversal of compression and limiting is not obtainable with conventional companders during heavy limiting because the amplitude of the compressed signal varies very little with a changing input signal, and conventional systems do not have the precision necessary to discriminate among very similar compressed signal levels to accurately reproduce the original signal. The present invention does not have this limitation, and can accurately reverse the limiting and compression applied to the stereo signal during encoding. The stereo signal can thus be encoded for optimum compatible transmission to provide reception equivalent to or superior to that of current transmitters for conventional FM radio receivers, and at the same time provide a dramatic increase in dynamic range for receivers which incorporate the novel decoder described herein.

The gain control signal is segregated from and does not interfere with the remainder of the transmitted signal. This results both from the fact that the gain control signal is applied to the 38 KHz subcarrier in phase quadrature relation to the encoded L−R signal centered on that subcarrier, and is thus 90° out of phase with the L−R signal, and also because the gain control signal is a low frequency signal which is substantially contained within the deadband between the L−R sidebands.

Figure 6:
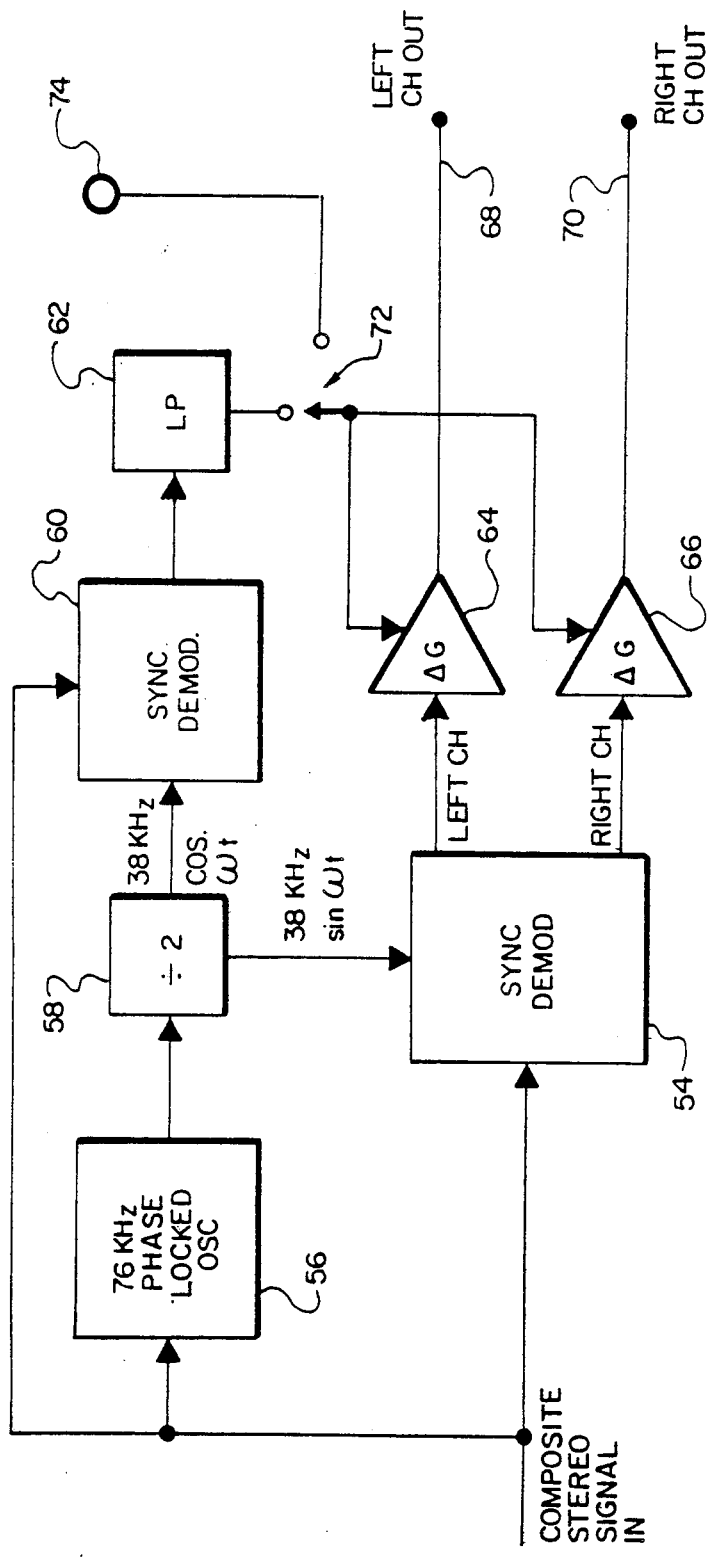
FIG. 6 is a block diagram of a decoder used in a radio receiver constructed in accordance with the invention.

A block diagram of the decoder is given in FIG. 6. The encoded L and R signals are recovered by a synchronous demodulator 54. A 38 KHz reference signal which is phase-locked to the received signal is applied as a reference for the synchronous demodulator 54. The 38 KHz reference signal is derived from a 76 KHz phase-locked oscillator 56 which is phase-locked to the received signal, and a frequency divider circuit 58 which divides the signal from oscillator 56 in half and applies it to synchronous demodulator 54. Frequency divider 58 also produces the phase quadrature, or cosine, component of the 38 KHz reference; this phase quadrature reference is applied to another synchronous demodulator 60 which also receives the input signal. The output of synchronous demodulator 60 is forwarded to a low pass filter 62, which is a duplicate of the low pass filter 40 in the encoder circuit. The action of synchronous demodulator 60 and low pass filter 62 is to recover the gain control signal from the phase quadrature component of the 38 KHz subcarrier. The recovered gain control signal is then applied to control the gains of variable gain control amplifiers 64 and 66, which respectively receive L and R channel inputs from the output of main signal synchronous demodulator 54. Decoding gain control amplifiers 64 and 66 are complementary to gain control amplifiers 32 and 34 in the encoding system, and thus decode their L and R channel inputs under the influence of the recovered gain control signal from low pass filter 62 to produce L and R channel outputs over output lines 68 and 70, respectively, substantially identical to the original L and R audio signals.

A switch 72 is provided between low pass filter 62 and the gain control amplifiers 64 and 66 to switch off the expanding effect of the recovered gain control signal and instead connect amplifiers 64 and 66 to a constant DC voltage terminal 74 when desired. Switch 72 can be set to operate automatically in the absence of a transmitted gain control signal, thus setting the receiver to a constant gain as in conventional receivers. It may be desired to provide a number of different constant voltage levels so that the receiver may be switched between different receiver settings such as MUTE and LOUD.

As noted, the decoding gain control amplifiers 64 and 66 are complementary to the encoding gain control amplifiers 32 and 34. For example, if the decoding amplifiers are designed so that their gain in dB is proportional to their control inputs, then the gain of the encoding amplifiers in dB should be proportional to the inverse of the control voltage. Thus, if the encoder system attenuates a signal by a certain number of dB in response to the presence of a given gain control voltage from low pass filter 40, the receiver decoder will increase the gain by exactly the same number of dB in response to the presence of the same gain control voltage from its low pass filter 62. In this way the encoding and decoding circuits are complementary. Such dB per volt gain control amplifiers are well known in the art and commonly available, the DBX Corp. 202VCA being one example. The amplifiers need not be linear in dB per volt, but merely complementary. For example, if the decoder increases the gain by an amount proportional to the input control voltage in a manner similar to a simple multiplier, then the encoder would decrease the gain by an amount proportional to the inverse of the control voltage.

Figure 7:
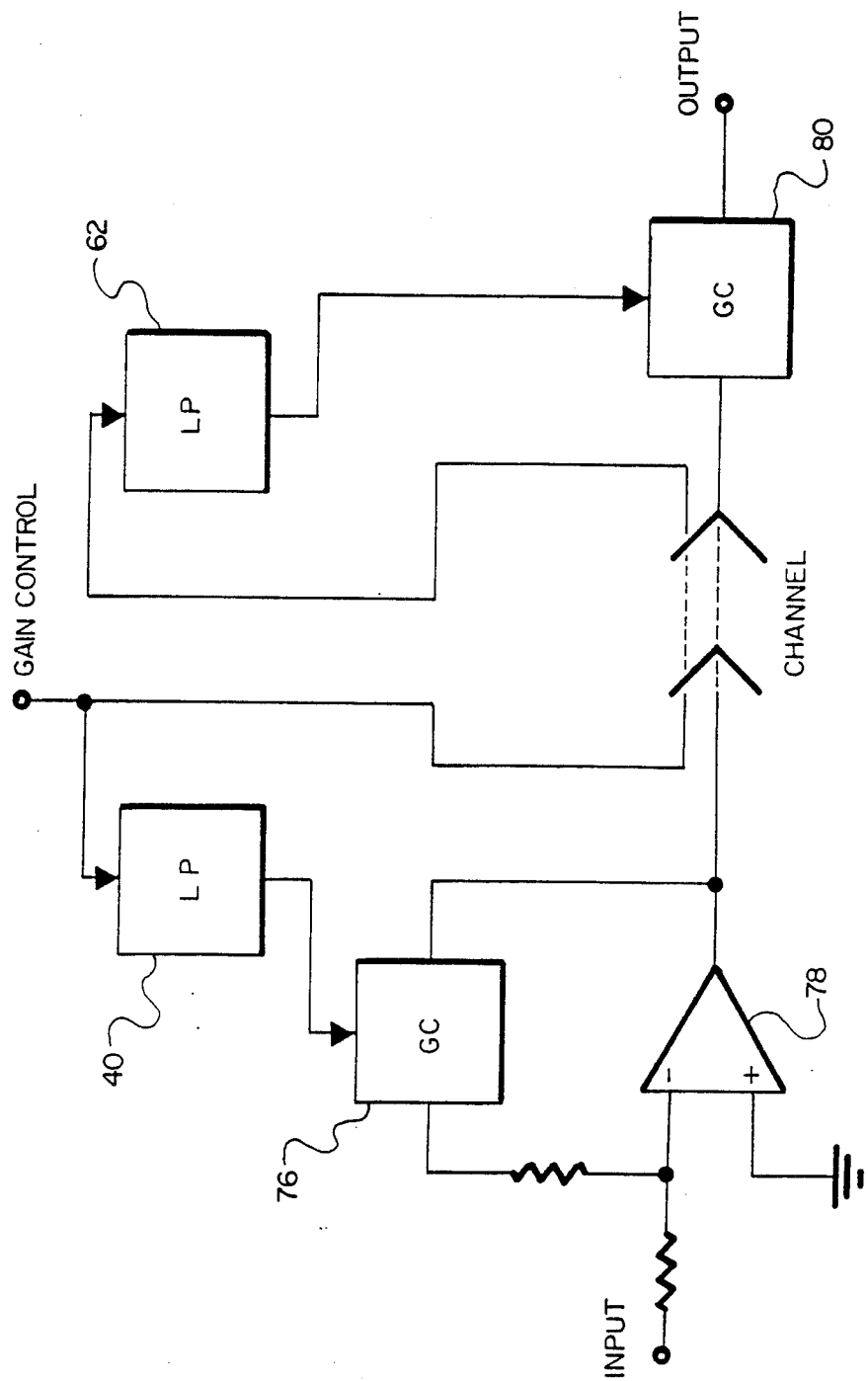
FIG. 7 is a block diagram of a preferred implementation of the gain control circuitry used in the encoder and decoder of FIGS. 5 and 6.

A convenient method to assure that the control functions are complementary is to place the gain control element in the feedback loop of an operational amplifier in the encoder, and an identical gain control element in the decoder as illustrated in FIG. 7. The gain control element 76, which may be implemented as a voltage control amplifier, is placed in the negative feedback loop of an operational amplifier 78. The encoding gain control signal is passed through low pass filter 40 to the control input of the gain control element 76. As previously stated, the low pass filter 62 in the decoder is identical to the encoder filter 40. The output of filter 62 is delivered to the control input of the decoding gain control element 80, which is identical to encoding gain control element 76 so that the output of decoding gain control element 80 is identical to the encoder input.

It should be noted that the low pass filters in the gain control path of the encoder and decoder serve dual purposes. First, by limiting the bandwidth of the gain control signal they minimize gain control noise. Secondly, they eliminate leakage of the encoded gain control signal into the L−R signal. 20 Hz low pass filters are preferred, although filters with higher frequency cutoffs can be used for decreased attack and release time.

FIGS. 8a–8g illustrate the relationship between the gain control signal and variations of the composite stereo signal. FIG. 8a illustrates the 19 KHz pilot tone, while FIG. 8b illustrates the reconstructed 38 KHz suppressed sine 84 and phase quadrature cosine 86 carrier signals. It can be seen that the 38 KHz sine signal 84 is in phase with the 19 KHz pilot signal, while the 38 KHz phase quadrature signal 86 is 90° out of phase with the sine signal 84. FIG. 8c illustrates the frequency deviation 88 of the main carrier signal due to modulation by a stereo signal in which the L and R signals are equal amplitude 4.75 KHz sine waves. Since L−R is zero, the frequency deviation trace 88 contains no 38 KHz component.

FIG. 8d illustrates the frequency deviation trace 90 of the main carrier signal due to modulation by a stereo signal in which the L signal is a 4.75 KHz tone and the right signal is zero. Four cycles of a 38 KHz signal are thus superimposed on each cycle of the 4.75 KHz tone.

In FIG. 8e the frequency deviation trace 92 of the main carrier signal is shown under modulation by a stereo signal in which the L and R components are equal amplitude 4.75 KHz sine waves 180° out of phase with each other. The frequency deviation trace 94 of the main carrier signal due to modulation by a stereo signal in which the L and R signals are in phase and equal amplitude 4.75 KHz tones is shown in FIG. 8f, with the addition of the 38 KHz cosine phase quadrature gain control signal used in the present invention. In FIG. 8g the frequency deviation trace 96 of the main carrier signal is shown due to modulation only by the gain control signal, with the L and R signals both equal to zero.

The examples given in FIGS. 8a–8g show that the inclusion of the gain control signal can increase the frequency deviation of the main carrier, as illustrated in FIG. 8f. This is to be expected, since the gain control signal represents additional energy and information added to the composite signal. Since it can increase the main carrier's frequency deviation, it is desirable that the gain control signal have a relatively small amplitude. Because of the band limiting applied to the gain control signal in the described circuits, that signal does not have to have a large amplitude to retain a desired low noise character. The low pass filters in the gain control circuits also diminish any effects of the L−R signal on the gain control signal.

Figure 9:
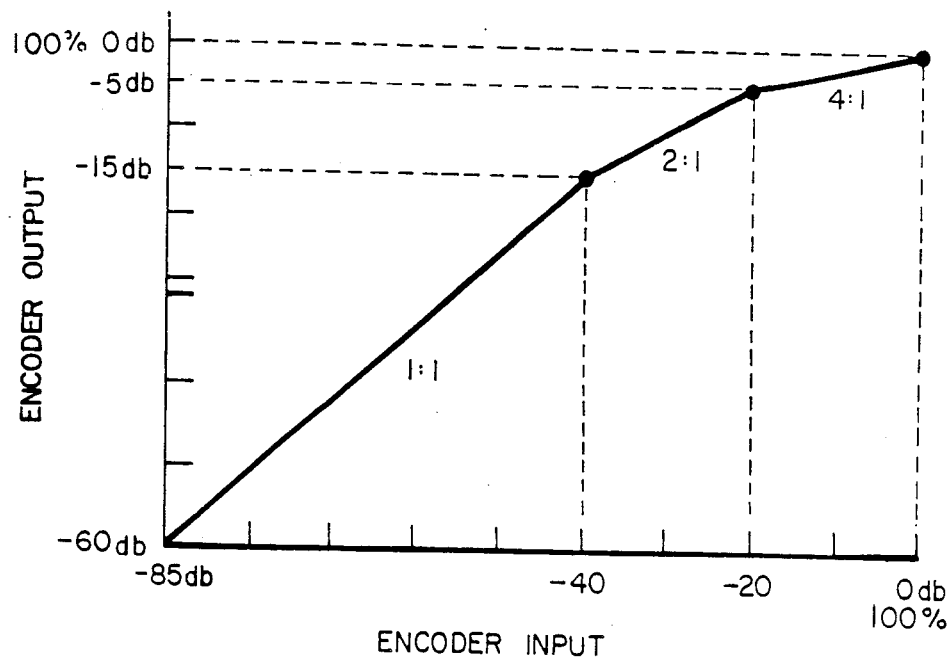
FIG. 9 is a graph of a typical compression curve for which the encoder may be designed.

Many different approaches can be taken to the design of the encoding control circuit 36, depending upon the desired limiting and compression characteristics. The following will illustrate the design parameters of the control circuit by means of an example. FIG. 9 shows one compression encoding curve that might be used. According to this curve, the encoder output in dB varies linearly with the input audio signal to the encoder between an input signal range of −85 and −40 dB. For input signals between −40 and −20 dB, the output variation is compressed and varies only half as much as the input variation. Between −20 and 0 dB for the input signal, the output signal is further compressed and varies only by one-fourth of the input signal variation.

Figure 10:
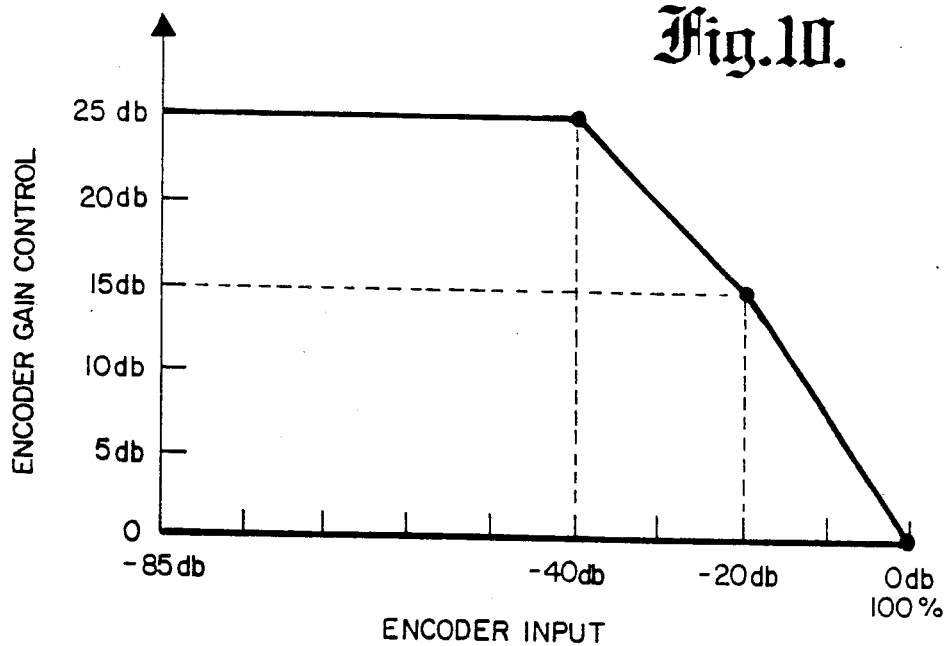
FIG. 10 is a graph of the encoder gain control pattern used to achieve the compression curve of FIG. 9.

FIG. 10 illustrates the amount of gain which is introduced in the encoding process to produce the encoding curve of FIG. 9; it is derived directly from the FIG. 9 curve. For simplicity, assume that the gain control elements used in the encoder are linear dB devices such as the DBX Corp. 202VCAs, and assume further that the feedback method described in connection with FIG. 7 is used to achieve complementary gain control. The VCAs used in this case as the control elements increase the signal gain with an increasing control voltage. Since the VCAs are in the feedback loop of operational amplifiers in the encoder, increasing their control voltages results in a decrease in the gain of the operational amplifiers. Accordingly, FIG. 10 illustrates the inverse of the required control voltage to achieve the encoding of FIG. 9. The encoder gain control thus remains at a constant dB level in the encoder input signal range of −85 to −40 dB, decreases along a straight line between −40 and −40 B, and decreases at a greater rate between −20 and 0 db.

Figure 11:
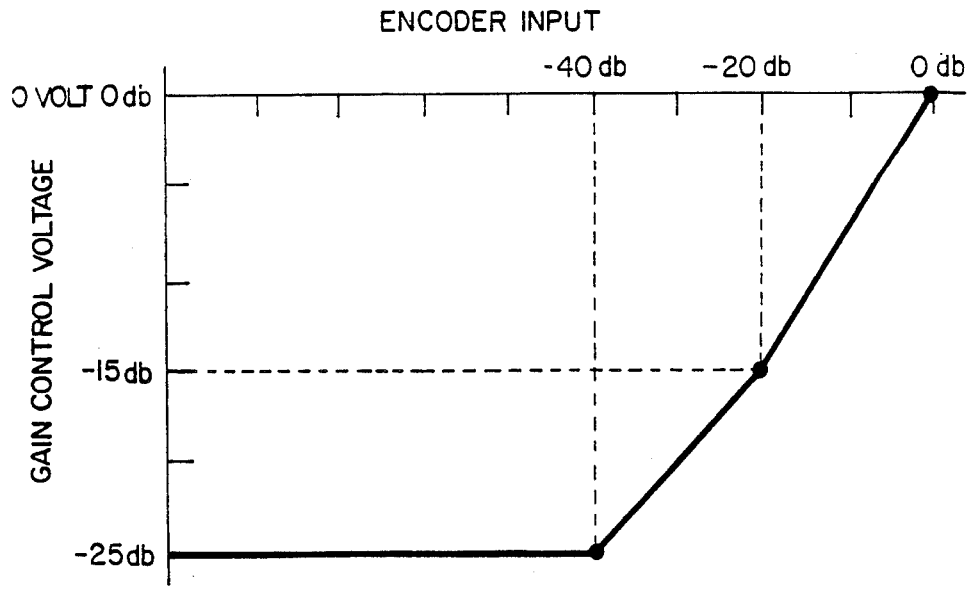
FIG. 11 is a graph of the gain control signal which is generated to achieve the gain control illustrated in FIG. 10.

The gain control signal for this example is illustrated in FIG. 11. To avoid overmodulation, the gain control signal should control the attenuation from a 100% audio signal, rather than the gain from a 0% audio signal. Thus, to leave the audio signal at its full amplitude, the gain control signal should be zero.

There is a great deal of flexibility in the design of the encoding control circuit 36 shown in FIG. 5. However, it is desirable to have the control circuit respond to short peaks in either the L+R or L−R signals and to provide an output which results in a gain control signal change that prevents FM modulation overload. At the same time, the gain control signal should follow the input signal peak envelope as closely as feasible, given the restrictions imposed by the limited bandwidth of the gain control signal.

Figure 12:
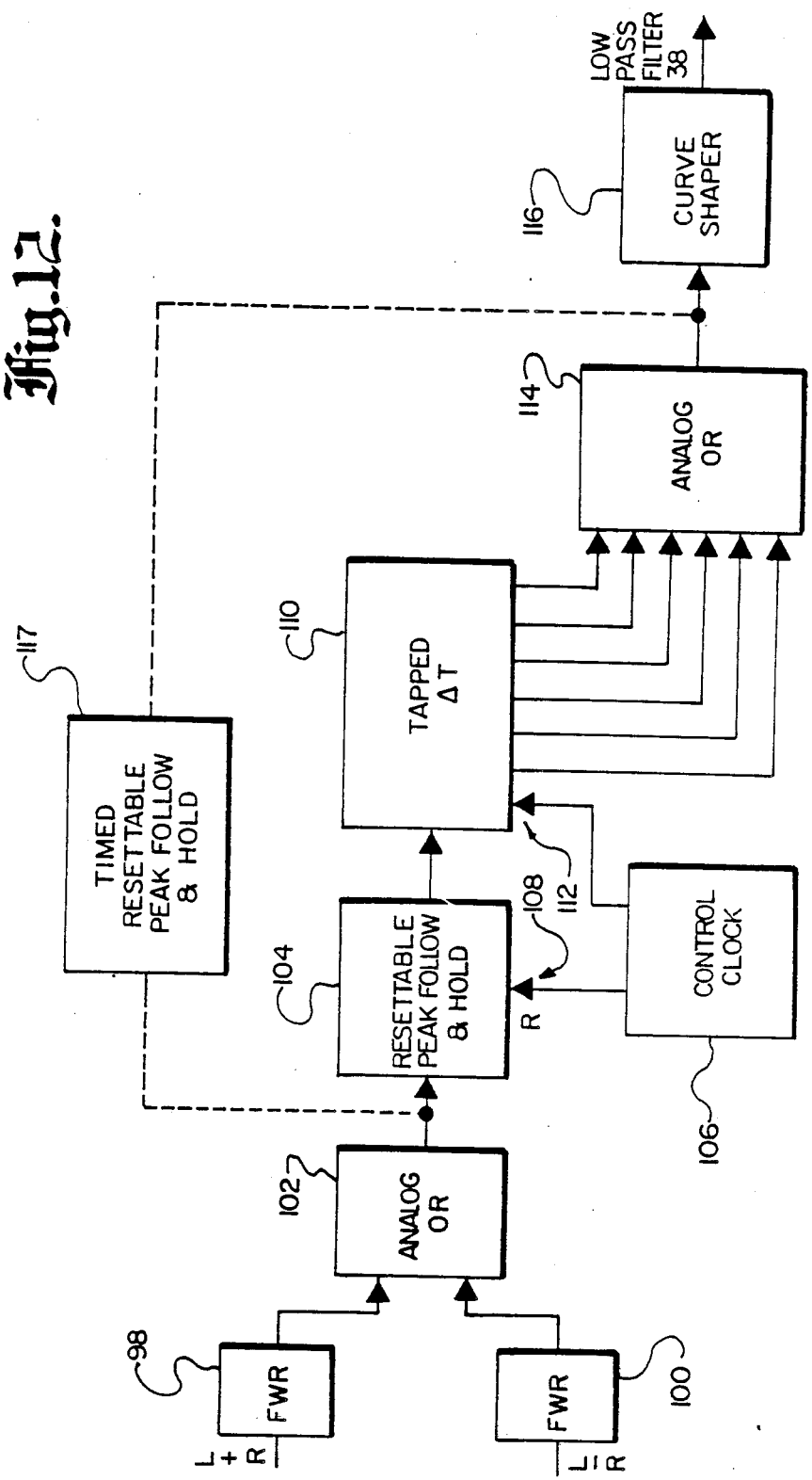
FIG. 12 is a block diagram of a control circuit used in the signal encoder.

A control circuit which accomplishes these objects is shown in FIG. 12. The L+R and L−R input signals are full wave rectified by rectifying circuits 98 and 100, respectively. The outputs of the rectifiers are applied to an analog OR circuit 102, which produces an output equal to the greater of the two values at its inputs. The output of analog OR circuit 102 is connected to a resettable peak follow and hold circuit 104 that holds the greatest value applied to it until it is reset by a control clock 106 via reset line 108. The output of the peak follow and hold circuit 104 is loaded into a tapped delay circuit 110. After a value has been loaded in, delay circuit 110 is reset by control clock 106 over reset line 112 to establish the largest signal value occurring during the most recent period. The tapped outputs of delay circuit 110 are connected to a second analog OR circuit 114, which outputs the greatest of the values at its inputs. Thus, the output of analog OR circuit 114 is equal to the greatest peak signal that occurred during the previous total delay time of delay circuit 110. The control clock 106 advances the delay circuit 110, inserts the output from peak follow and hold circuit 104, and then resets circuit 104. The output of analog OR circuit 114 is delivered to a curve shaper circuit 116, which is designed to establish the desired compression curve. The total delay imposed by tapped delay circuit 110 should be at least equal to the response time of low pass filters 38 and 40 in series, typically 10–25 milliseconds. A single time resettable peak follow and hold circuit which is reset in 10–25 milliseconds if its held value is not exceeded by its input can be used in most applications to replace elements 104, 106, 110 and 114. Such a circuit is indicated by reference numeral 117 in FIG. 12, shown connected by dashed lines between analog OR circuit 102 and curve shaper circuit 116.

Rather than using a single curve shaping circuit, a plurality of different circuits can be used to generate a plurality of different gain control signals responding to respective signal compression and limiting characteristics. This gives the transmitter the flexibility of selecting any of a number of different compression curves. Such a capability is useful in the case of a central transmitter which is transmitting to a large number of radio receivers, some of which may be equipped with the decoding circuitry of the invention and others of which are conventional. While the receivers equipped with the decoding circuits will restore essentially the original stereo signal, those without the decoding apparatus will not have this capability. Thus, the provision of different selectable compression curve shaping circuits provides the flexibility to tailor the signal compression characteristics to the type of programming being transmitted for receivers without decoding circuitry as described herein.

Figure 13:
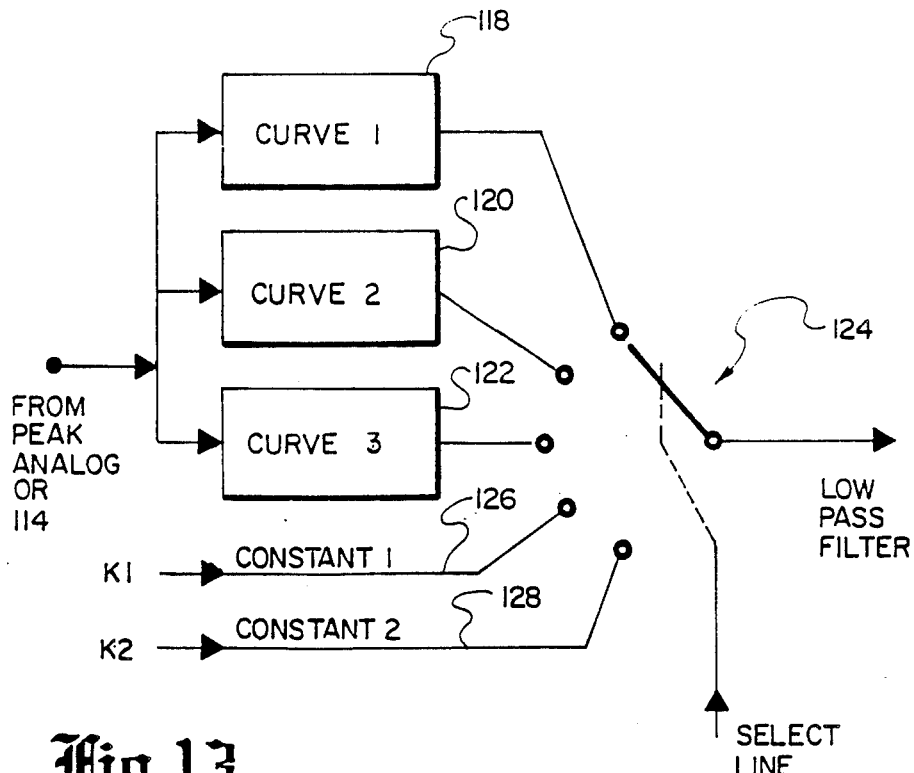
FIG. 13 is a block diagram of a subcircuit within the control circuit for selecting between different compression curves.

FIG. 13 is a block diagram of an implementation of the compression curve shaping circuitry by which one of a plurality of different gain control signal generators can be selected to provide flexibility in choosing the exact compression curve to be employed. The signal from the peak analog OR circuit 114 of FIG. 12 is delivered to three different curve generating circuits 118, 120 and 122, each of which generates a unique compression curve. An electronic or mechanical switch 124 selects which of the different curve generating circuits is to be used. In addition, constant voltage levels may be provided over lines 126 and 128 in the event linear compression curves may be desired. Constant control selects could be used, for example, to mute the channel or to achieve other special effects.

As an alternate to a fixed number of predetermined compression curves, a compression curve shaper could be implemented that would provide a curve whose characteristics were determined by the input audio signals currently being received. For example, the curve shaper could be programmed to have one response for high frequencies, a different response for low frequencies, and graduated responses for intermediate or combined frequencies.

During decoding, a DC offset in the gain control signal will result in an overall signal level change. If there is a gain error in the control signal, it will result in the decoded program remaining compressed to a degree if the gain level of the control signal is low, or in an overexpansion of the decoded program if the control signal gain it too high. Accordingly, the gain of the recovered gain control signal in the decoder should be accurate.

In the invention as described, the gain control elements may have frequency dependent gain control characteristics, or the control circuit characteristics may also be frequency dependent. That is, the gain control element may vary the gain of only a part of the audio spectrum or may be an electrically controlled variable filter such as that in the National Semiconductor PM1894. In this event, reasonable compatibility can be maintained with conventional FM reception while a large amount of frequency selective noise reductin is provided. High frequencies would be amplified more in transmission than lower frequencies, depending upon the amount of high frequency present in the input L and R signals. The present invention allows the gain of the signal to be adjusted depending upon the spectral character of the signal, as well as its level. This can be used to minimize some of the undesirable psychoaccoustic effects of conventional compressors.

A novel system and method for FM transmission which results in lower noise and a more accurate reproduction of the original audio signal has thus been shown and described. It should be understood that numerous modifications and alternate embodiments will occur to those skilled in the art without deviating from the spirit of the invention. For example, while only combinations of the L and R signals are encoded and decoded in the described embodiments, it would also be possible to encode the gain control signal itself for transmission along with the encoded L and R signals, and then extract and decode the gain control signal in the receiver for use in decoding the remainder of the transmitted signal. Also, the L and R signals could be encoded before being matrixed into L+R and L−R signals, rather than afterward as in the described embodiments. It is also not strictly necessary that the restoration of the transmitted signal be accomplished in a manner absolutely complementary to the encoding. It may be desirable to deviate from a complementary decoding to produce certain audio effects, in which case either the recovered gain control signal or the decoding circuitry can be skewed somewhat from a strict complement to the corresponding elements in the encoder system. As another example, the gain control signal has been described as being transmitted within the low frequency deadband centered on the 38 KHz subcarrier. Other deadbands exist in the transmission frequency spectrum that might likewise be occupied by the gain control signal, although the 38 KHz subcarrier is already available and is preferred. Thus, it is intended that the invention be limited only in terms of the appended claims.

I claim:

1. In a frequency modulated (FM) transmission and reception system for an input audio stereo signal having left (L) and right (R) components, the system including means for forming L+R and L−R signals, means for encoding the L+R and L−R signals, the encoding means having a slower response time than the rate of change of the audio signals for which the system is designed, means for frequency modulating and transmitting the encoded signals on a carrier broadcast signal with the encoded L+R signal centered on the broadcast frequency and a double sideband encoded L−R signal centered on a 38 KHz subcarrier of the broadcast signal, means for receiving the transmitted signal, and means for decoding the received signal, the improvement comprising:

(a) in the encoding means:
  (1) means responsive to the L+R and L−R signals for generating a gain control signal having a frequency bandwidth less than the input audio stereo signal frequency bandwidth
  (2) means for delaying the L+R and L−R signals for a delay period at least equal to the time required to generate the gain control signal,
  (3) means for applying the gain control signal to encode both the L+R and L−R signals,
  (4) means for modulating the 38 KHz subcarrier with the gain control signal in phase quadrature relation to the L−R signal, thereby substantially insulating it from interfering with the encoded L−R signal centered on the 38 KHz subcarrier, and
  (5) means for transmitting the modulated phase quadrature component of the 38 KHz subcarrier along with the delayed and encoded L+R and L−R signals, and (b) in the decoding means:
  (1) means for recovering a signal corresponding to the low frequency gain control signal from the received phase quadrature component of the 38 KHz subcarrier,
  (2) means for deriving encoded L and R signals from the received encoded L+R and L−R signals, and
  (3) means for applying the recovered gain control signal to decode the L and R signals in a manner complementary to the encoding of the L+R and L−R signals in the encoding means.

2. The system of claim 1, further comprising means for generating a plurality of different gain control signals corresponding to respective signal compression and limiting characteristics, and means for selecting among said compression and limiting characteristics to control the encoding of the L+R and L−R signals.

3. The system of claim 2, said selecting means comprising means for varying the compression and limiting characteristics in response to a varying frequency spectral character of the L+R and L−R signals.

4. The system of claim 1, wherein the gain control signal generating means includes digital means for responding to the L+R and L−R signals.

5. In a frequency modulated (FM) transmitter for an input stereo audio signal having left (L) and right (R) components, the transmitter including means for forming L+R and L−R signals, means for encoding the L+R and L−R signals, the encoding means having a slower response time than the rate of change of the audio signals for which the transmitter is designed, and means for frequency modulating and transmitting the encoded signals on a carrier broadcast signal with the encoded L+R signal centered on the broadcast frequency and a double sideband encoded L−R signal centered on a 38 KHz subcarrier of the broadcast signal, the improvement comprising:

means responsive to the L+R and L−R signals for generating a gain control signal having a frequency bandwidth less than the input audio stereo signal frequency band width,
means for delaying the L+R and L−R signals for a delay period at least equal to the time required to generate the gain control signal,
means for applying the gain control signal to encode both the L+R and L−R signals,
means for modulating the 38 KHz subcarrier with the gain control signal in phase quadrature relation to the L−R signal, thereby substantially insulating it from interfering with the encoded L−R signal centered on the 38 KHz subcarrier, and
means for transmitting the modulated phase quadrature component of the 38 KHz subcarrier along with the delayed and encoded L+R and L−R signals.

6. The FM transmitter of claim 5, further comprising means for generating a plurality of different gain control signals corresponding to respective signal compression and limiting characteristics, and means for selecting among said compression and limiting characteristics to control the encoding of the L+R and L−R signals.

7. The FM transmitter of claim 6, said selecting means comprising means for varying the compression and limiting characteristics in response to a varying frequency spectral character of the L+R and L−R signals.

8. The FM transmitter of claim 5, wherein the gain control signal generating means includes digital means for responding to the L+R and L−R signals.

9. In a receiver for frequency modulated (FM) electromagnetic signals adapted to receive encoded signals representing the left (L) and right (R) components of stereo audio signals both formatted into encoded L+R and L−R signals by means of a gain control signal having a frequency bandwidth less than the stereo audio signal frequency bandwidth, the L+R and L−R signals being respectively centered on a transmission carrier frequency and on a subcarrier thereof, the improvement comprising:

means for recovering from the received signals a restoration signal corresponding to the gain control signal, and
means for applying the restoration signal to control the gain of the received signal in a predetermined manner corresponding to the gain control signal, thereby enabling substantail restoration of the original stereo signal subject to any desired gain variation.

10. The receiver of claim 9, wherein the received signal includes the gain control signal transmitted on the subcarrier in phase quadrature relation to the L−R signal, the receiver including means for recovering the restoration signal from said phase quadrature component of the subcarrier.

11. The receiver of claim 9, including means for recovering the restoration signal from a subaudio deadband centered on the subcarrier.

12. In a frequency modulated (FM) transmission and reception system having means for encoding an input stereo signal within an allocated frequency band of the electromagnetic spectrum, means for frequency modulating and transmitting the encoded signal, means for receiving the transmitted signal, and means for decoding the received signal, the improvement comprising:
 (a) in the encoding means:
  (1) means responsive to the input stereo signal for generating a gain control signal having a frequency bandwidth less than the input stero signal frequency bandwidth over a predetermined response time,
  2) means for delaying the input stereo signal for a delay period at least equal to the time required to generate the gain control signal,
  (3) means for applying said gain control signal to encode the delayed stereo signal by controlling the gain of substantially the entire delayed stereo signal, and
  (4) means for transmitting the gain control signal along with, but without substantially interfering with, the delayed and encoded stereo signal, and
 (b) in the decoding means:
  (1) means responsive to the transmitted gain control signal for generating a restoration control signal which corresponds to the gain control signal, and
  (2) means for applying said restoration control signal to control the gain of the received signal in a predetermined manner corresponding to the encoding of the transmitted signal, thereby enabling restoration of the original stereo signal, subject to any desired gain variation, by the decoding means.

13. The system of claim 12, wherein the restoration control signal is applied to control the gain of the received signal in a manner substantially complementary to the gain control applied to the input stereo signal, thereby substantially eliminating the gain control from the received signal and enabling substantial restoration of the original stereo signal.

14. The system of claim 12, for use in FM systems in which the encoding means generates a double sideband suppressed carrier signal representing the difference between the left and right stereo channels, said double sideband signal being centered on a subcarrier signal frequency and separated therefrom by a frequency deadband, wherein the gain control signal is imposed on said subcarrier frequency.

15. The system of claim 14, wherein the gain control signal is imposed in phase quadrature relation to the double sideband suppressed carrier signal on said subcarrier frequency.

16. The system of claim 15, wherein said subcarrier frequency is 38 KHz.

17. The system of claim 12, wherein said signal delay is greater than the gain control response time, and said restoration control signal generating means includes means for delaying the restoration control signal by an amount sufficient to substantially synchronize the restoration control signal with the received encoded signal.

18. The system of claim 12, the means for generating a gain control signal including a peak follower circuit connected to receive inputs from the input stereo signal and to provide an output signal representing the peak of its input signals, and an encoder connected to receive the peak follower output and adapted to produce a gain control signal which varies with the peak follower output in accordance with a predetermined gain function.

19. The system of claim 18, including means for providing left (L) and right (R) signal inputs to the peak follower circuit representing L+R and L−R.

20. The system of claim 19, wherein the peak follower circuit is adapted to hold the peak of its input signals for a period approximately equal to the response time of the remainder of the gain control signal generating means.

21. The system of claim 12, further comprising means for generating a plurality of different gain control signals corresponding to respective signal compression and limiting characteristics, and means for selecting among said compression and limiting characteristics to control the gain of the encoded signal.

22. The system of claim 21, said selecting means comprising means for varying the compression and limiting characteristics in response to a varying frequency spectral character of the L+R and L−R signals.

23. A signal encoder for encoding an input stereo signal for frequency modulated (FM) transmission within an allocated frequency band of the electromagnetic spectrum, the transmitted signal occupying only a portion of said frequency band and leaving at least one stereo frequency deadband with substantially no encoded stereo signal, comprising:
 means responsive to the input stereo signal for generating a gain control signal having a frequency bandwidth less than the input stereo signal and a bandwidth and no greater than a selected stereo frequency deadband,
 means for applying said gain control signal to control the gain of substantially the entire stereo signal, and
 means for transmitting said gain control signal along with the encoded stereo signal in said selected stereo frequency deadband.

24. The signal encoder of claim 23, further comprising means for generating a double sideband signal representing the difference between the left and right stereo channels, said double sideband signal being centered on a subcarrier frequency and separated therefrom by said frequency deadband, wherein the gain control signal is imposed on said subcarrier frequency.

25. The signal encoder of claim 24, wherein the gain control signal is imposed in phase guadrature relation to the double sideband signal on said subcarrier frequency.

26. The signal encoder of claim 25, wherein said subcarrier frequency is 38 KHz.

27. The signal encoder of claim 23, the means for generating a gain control signal including a peak follower circuit connected to receive inputs from the input stereo signal and to provide an output signal representing the peak of its input signals, and an encoder connected to receive the peak follower output and adapted to produce a gain control signal which varies with the peak follower output in accordance with a predetermined gain function.

28. The signal encoder of claim 27, including means for providing left (L) and right (R) signal inputs to the peak follower circuit representing L+R and L−R.

29. The signal encoder of claim 28, wherein the peak follower circuit is adapted to hold the peak of its input signals for a period approximately equal to at least the response time of said encoder of the gain control signal generating means.

30. The signal encoder of claim 23, further comprising means for generating a plurality of different gain control signals corresponding to respective signal compression and limiting characteristics, and means for selecting among said compressors and limiting characteristics to control the gain of the encoded signal.

31. The signal encoder of claim 30, said selecting means comprising means for varying the compression and limiting characteristics in response to a varying frequency spectral character of the L+R and L−R signals.

32. A method of encoding and transmitting an input stereo signal in a frequency modulated (FM) format, comprising the steps of:
generating a gain control signal in response to the input stereo signal over a predetermined response time,
delaying the input stereo signal for a delay period sufficient to complete the generation of the gain control signal.
applying the gain control signal to encode the delayed stereo signal by controlling its gain,
segregating the gain control signal from the encoded stereo signal, and
frequency modulating and transmitting the gain control and encoded stereo signals as a composite signal.

33. The method of claim 32, wherein the input stereo signal includes left (L) and right (R) components and is formatted into L+R and L−R signals, the L−R signal is encoded and applied as a double sideband modulating signal centered on a subcarrier frequency, and the gain control signal is applied as a modulating signal in phase quadrature relation to the L−R signal on the subcarrier.

34. The method of claim 32, wherein the input stereo signal includes left (L) and right (R) components and is formatted into L+R and L−R signals, the L−R signal is encoded and applied as a double sideband modulating signal surrounding a deadband centered on a subcarrier frequency, and the gain control signal is generated with a bandwidth substantially no greater than said deadband and is transmitted within said deadband.

35. The method of claim 32, further comprising the step of selecting one of a plurality of different gain control signals corresponding to respective signal compression and limiting characteristics and utilizing the selected gain control signal to encode the delayed stereo signal.

36. The method of claim 35, wherein the input stereo signal includes left (L) and right (R) components and is formatted into L+R and L−R signals, and the compression and limiting characteristics of the selected gain control signal are varied in response to a varying frequency spectral character of the L+R and L−R signals.

* * * * *

UNITED STATES PATENT AND TRADEMARK OFFICE
CERTIFICATE OF CORRECTION

PATENT NO. : 4,704,727
DATED : November 3, 1987
INVENTOR(S) : Beard, Terry D.

It is certified that error appears in the above-identified patent and that said Letters Patent is hereby corrected as shown below:

Column 14, line 42, delete "and a".

Signed and Sealed this

Tenth Day of May, 1988

Attest:

DONALD J. QUIGG

Attesting Officer

Commissioner of Patents and Trademarks